United States Patent [19]

Naumann

[11] Patent Number: 4,816,770
[45] Date of Patent: Mar. 28, 1989

[54] ADAPTIVE FM THRESHOLD EXTENSION DEMODULATOR

[75] Inventor: Gerhard R. Naumann, Green Lawn, N.Y.

[73] Assignee: Satellite Transmission Systems, Hauppauge, N.Y.

[21] Appl. No.: 72,147

[22] Filed: Jul. 10, 1987

[51] Int. Cl.[4] .............................................. H03D 3/00
[52] U.S. Cl. .................................... 329/122; 331/17; 455/266
[58] Field of Search ....................... 329/110, 122, 123; 331/17, 23; 455/260, 266, 312

[56] References Cited

U.S. PATENT DOCUMENTS

4,479,091 10/1984 Yoshisato ............................ 329/122

Primary Examiner—Eugene R. LaRoche
Assistant Examiner—Robert J. Pascal
Attorney, Agent, or Firm—Hopgood, Calimafde, Kalil, Blaustein & Judlowe

[57] ABSTRACT

Multi-channel telephone communication is enhanced by the use of the adaptable threshold extension demodulator described in this patent. These devices permit adjustment of the threshold depending on the present loading of the baseband. By changing the characteristics of the feedback loop in the demodulator, the threshold can be adjusted for optimal performance. The sensor may take one of two forms. In a first embodiment, the sensor detects baseband loading by converting the baseband to a DC level. In another form, frequency selective filters determine the highest level of the baseband and convert that into an incremental level signal. In a variation of the second embodiment, a low-pass filter and a bandpass filter detect the loading directly from the IF signal.

31 Claims, 11 Drawing Sheets

ADAPTIVE FM THRESHOLD EXTENSION DEMODULATOR

BACKGROUND OF THE INVENTION

1. Field of the Invention

This invention relates to frequency modulation (FM) communication systems. More particularly, this invention relates to a threshold extension demodulator for an FM system.

2. Description of Related Art

Frequency modulation is commonly used as a method for transmission of multi-channel telephone information. A representative system may have a designated capacity of 900 separate channels. At any given time, only a portion of these channels are in use. As requirements change, the system may expand or contract in certain predetermined incremental steps. For example, there can be increments of 300 channels each. Thus, the system may configure itself to handle 300, 600, or a maximum of 900 separate channels.

The loading requirements of the system may change due to various factors. One of these, of course, is traffic demands. During the middle of the day, for example, a maximum number of conversations are occurring, requiring greater loading. Loading requirements may also vary with the seasons. In the summer, especially during rainy periods, a larger number of channels are required due to individual channel failure.

Any given system has an optimum bandwidth. The amount of loading dictates the actual bandwidth in use. It is not possible, given current technology, to design a system which will accommodate a change of bandwidth of one to three, which would correspond to the loading variations discussed above. Further, for any given bandwidth, the system has a fixed quantity of inherent noise. If the system demodulator is optimized for a particular bandwidth, the noise characteristic will remain constant, regardless of the bandwidth of the baseband signal present. When the carrier power in the bandwidth approaches the noise level of the receiver, a sudden and substantial degradation will occur in the voice channel performance.

This phenomenon, present in all FM systems, is commonly known as the FM threshold effect, which occurs when the received carrier level decreases to the point where it approaches the thermal noise level of the receiver. When conventional wide band FM demodulators are used, this FM threshold occurs when the carrier is 10 to 12 dB above the thermal noise level of the receiver. As the carrier level decreases below this point, a substantial increase in background noise occurs in the telephone channels and bit-error-rates (BER) increase significantly for data communication circuits within the telephone channel.

A threshold extension demodulator can decrease the point at which FM threshold occurs by up to 7 dB under some conditions. That is, the point at which the FM threshold occurs is 3 to 5 dB above the thermal noise level of the receiver. A threshold extender therefore increases the dynamic range of an FM receiver by its threshold improvement factor, 7 dB in the above example. This phenomenon is well understood and the use of threshold extension techniques is quite common these days. Several types of threshold extension demodulators are in use and some of them are known by the following terminology: the phase-locked loop demodulator, the FM feedback demodulator, and the tracking filter demodulator.

Threshold extension demodulators are normally designed to compensate for one specific bandwidth. In a system where the bandwidth is subject to constant change, the benefit gained by the extension demodulator will be lost as the threshold point will not be optimized for the different bandwidths encountered by the demodulator.

OBJECTS OF THE INVENTION

It is an object of the invention to provide a threshold extension demodulator which is adaptable to a wide variety of bandwidth conditions.

It is a further object of the invention to provide a threshold extension demodulator which senses the loading of the baseband.

It is a further object of the invention to provide an adaptable threshold extension demodulator which is not sensitive to amplitude levels of the baseband signal.

SUMMARY OF THE INVENTION

These objects as well as others not enumerated here are achieved by the invention, one embodiment of which may include a threshold extension demodulator having a baseband loading level sensor. The input to the sensor is the baseband output of the demodulator. The sensor creates an incremental or variable output representative of the loading of the baseband. For example, the sensor could provide three outputs representing 25%, 50%, and 75%, respectively, of loading of the baseband. The sensor may achieve this result by detecting the amplitude level of a rectified baseband signal or by using frequency selective filtering of the baseband. The incremental outputs in turn control a filtering element in the threshold extension demodulator. For example, in a phase-locked loop demodulator, the low pass filter following the phase detector could be adjusted by activating a series of resistors.

The result of the sensing is that the bandwidth is adjusted specifically for each degree of loading and thus the appropriate FM threshold. Should the loading change at any given time, the sensor will detect this and readjust the demodulator accordingly.

BRIEF DESCRIPTION OF THE DRAWINGS

A more complete understanding of the present invention, as well as other objects and advantages thereof not enumerated, will become apparent upon consideration of the following detailed description, especially when considered in light of the accompanying drawings, wherein.

DETAILED DESCRIPTION OF THE INVENTION

Figure 1:
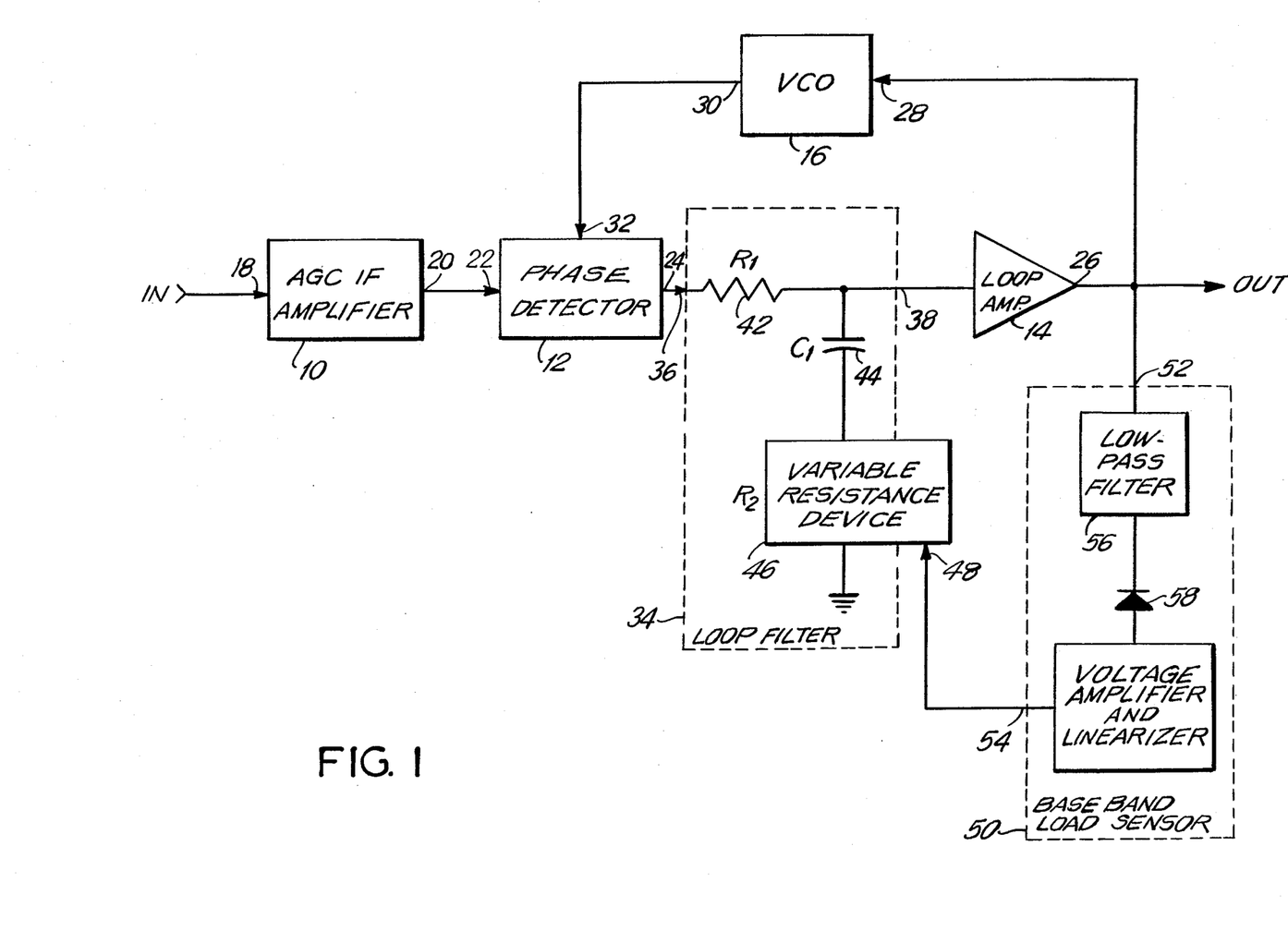
FIG. 1 is a block diagram of a phase-locked loop threshold extension demodulator having a baseband loading sensor.

A phase-locked loop demodulator, incorporating the invention, is illustrated in FIG. 1. The elements of the phase-locked loop are an AGC IF amplifier 10, a phase detector 12, a loop amplifier 14, and a voltage-controlled oscillator (VCO) 16. The AGC IF amplifier 10 has an input 18 which receives the IF signal, which contains the baseband modulation. The AGC IF amplifier 10 has an output 20 connected to the signal input 22 of the phase detector 12. The phase detector 12 has an output 24, which would generally be connected to the loop amplifier 14 in a conventional phase-locked loop. As explained further on, it will pass through another element.

The loop amplifier 14 has an output 26 which functions as the output of the phase-locked loop and contains the baseband signal output. It is connected to the input 28 of the VCO 16. The output 30 of the VCO 16 is connected to the feedback control input 32 of the phase detector 12.

The elements described above comprise a phase-locked loop. The threshold extension characteristics are achieved by inserting a low-pass filter 34 in the loop. The output 24 of the phase detector 12 is connected to the input 36 of the low-pass filter 34, and the output 38 of the low-pass filter 34 is connected to the input 40 of the loop amplifier 14, closing the loop.

Figure 2:
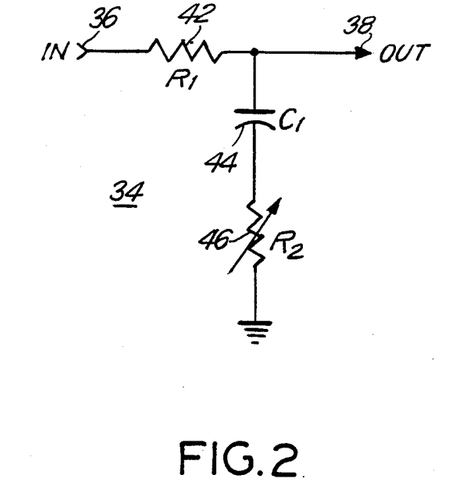
FIG. 2 is a schematic diagram of an R—C—R configuration for the loop low-pass filter.

The configuration of the low-pass filter 34 illustrated in FIG. 1 is that of an R—C—R filter, as also shown in FIG. 2. Returning to FIG. 1, the low-pass filter 34 has three components: $R_1$ 42, $C_1$ 44, and $R_2$ 46, which is depicted here as a variable resistance device. Resistor $R_1$ 42 is connected between the input 36 and the output 38 of the low-pass filter 34. Capacitor $C_1$ 44 is connected between the junction of $R_1$ 42 and the filter output 38, and the variable resistance device $R_2$ 46. The other end of $R_2$ 46 is connected to ground. The variable resistance device $R_2$ 46 also has a control input 48, which will be discussed further on.

The low-pass filter 34 is an adjustable device and is controlled by a baseband loading sensor 50. The baseband loading sensor 50 has an input 52 connected to the output 26 of the loop amplifier 14. As noted previously, the signal appearing at this point is the demodulated baseband signal. The output 54 of the baseband loading sensor 50 is a variable voltage signal, which is supplied to the voltage control input 48 of the variable resistance device $R_2$ 46.

The function of the baseband loading sensor 50 is to convert the demodulated baseband signal to an amplitude-dependent control voltage which ultimately controls and varies the characteristics of the low-pass filter 34. The baseband loading sensor 50 illustrated in FIG. 1 has three components: a low-pass filter 56, a detector or rectifier 58, and a voltage amplifier and linearizer 60, connected in series, in that order, between the input 52 and the output 54. As the baseband loading changes, the baseband loading sensor 50 will provide a voltage variable output that varies proportionally with respect to the changes in the loading. In turn, the cutoff point of the low-pass filter 34 will vary, adjusting the threshold point for the phase-locked loop demodulator.

Figure 3:
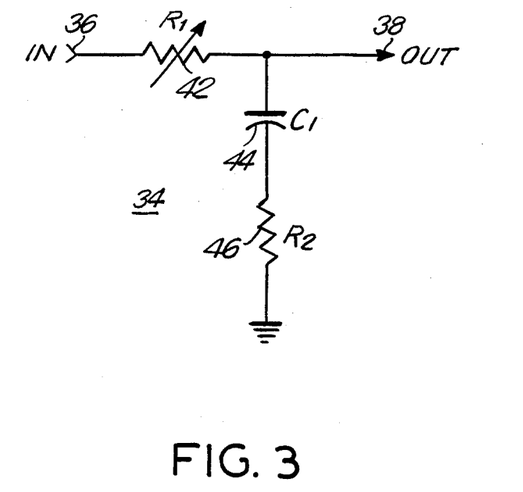
FIG. 3 is a schematic diagram of another form of an R—C—R configuration for the loop low-pass filter.
Figure 4:
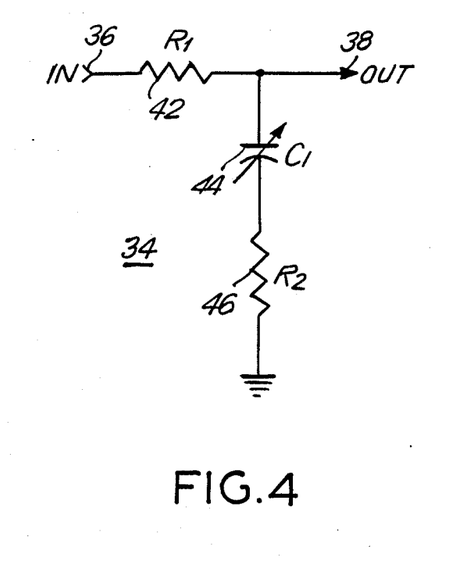
FIG. 4 is a schematic diagram of another form of an R—C—R configuration for the loop low-pass filter.
Figure 5:
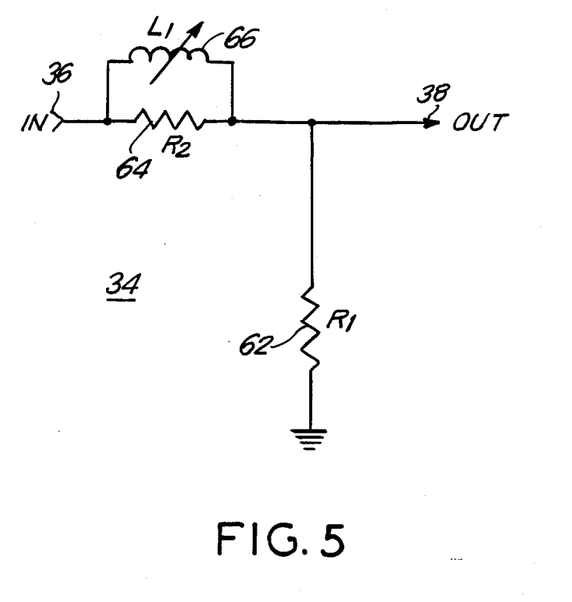
FIG. 5 is the inductive equivalent of the circuit illustrated in FIG. 4.

The low-pass filter 34 may take other forms, as illustrated in FIGS. 3, 4, and 5. In FIG. 3, $R_1$ 42 is made variable as opposed to $R_2$ 46. Alternatively, the capacitor $C_1$ 44 could be the variable element as illustrated in FIG. 4. If it would be more desirable to use a variable inductor, the circuit arrangement illustrated in FIG. 5, containing resistors $R_1$ 62 and $R_2$ 64 and inductor $L_1$ 66, may be employed.

The variable elements may take different forms For example, the variable resistance can be a field effect transistor (FET). By adjusting the bias applied to the gate of the FET, the device will function as a variable resistance between the source and the drain. For the capacitance, a varactor diode may be employed.

Figure 6:
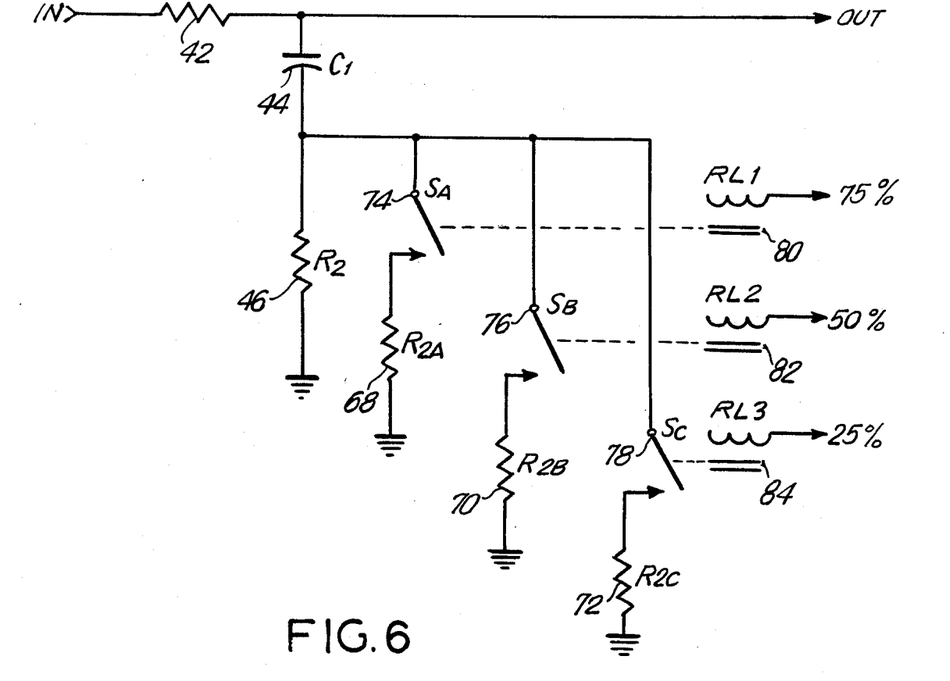
FIG. 6 is a schematic diagram of a R—C—R filter having discrete switched resistances.

The variable resistance element may also be a series of switched devices as illustrated in FIG. 6. The control from the baseband loading sensor 50 will then be a series of discrete lines as opposed to a single variable amplitude signal. As in FIG. 2, the low-pass filter 34 illustrated in FIG. 6 has a resistor $R_1$ 42, a capacitor $C_1$ 44, and a second resistor $R_2$ 46. Additional shunt resistors $R_{2A}$ 68, $R_{2B}$ 70, and $R_{2C}$ 72 are connected by switches $S_A$ 74, $S_B$ 76, and $S_C$ 78, in parallel with resistor $R_2$ 46. The discrete control signals 80, 82, and 84, respectively, from the baseband loading sensor 50 control the switches $S_A$ 74, $S_B$ 76, and $S_C$ 78, respectively.

Figure 7:
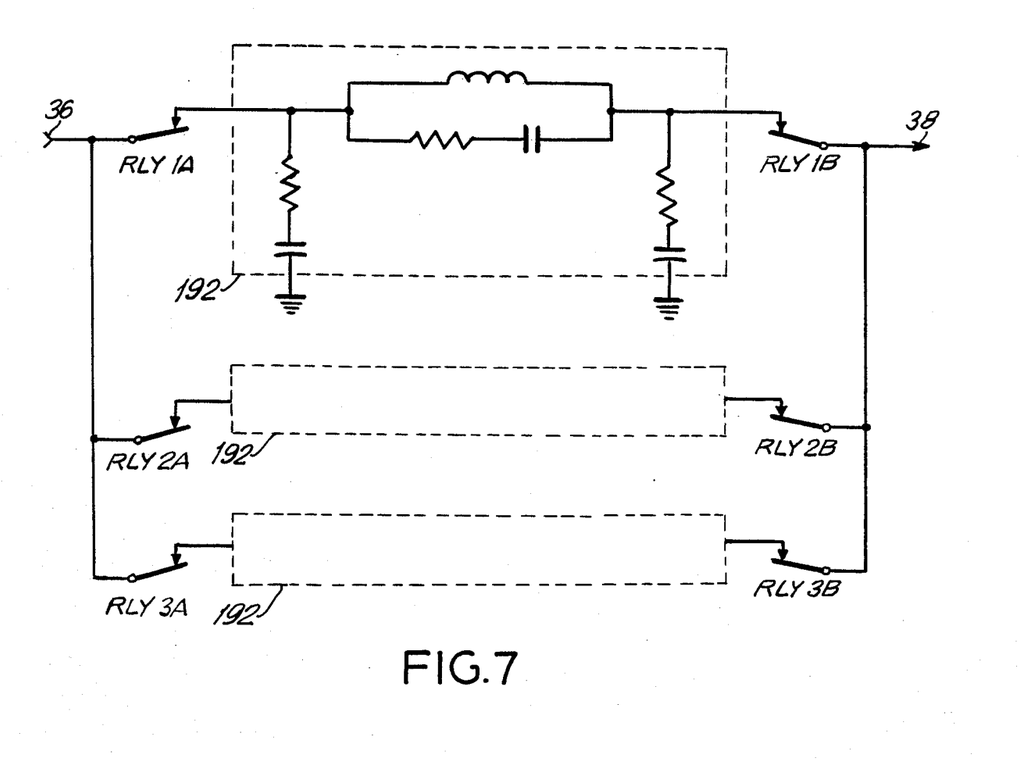
FIG. 7 is a schematic diagram of a low-pass filter comprised of switchable discrete filter elements.
Figure 8:
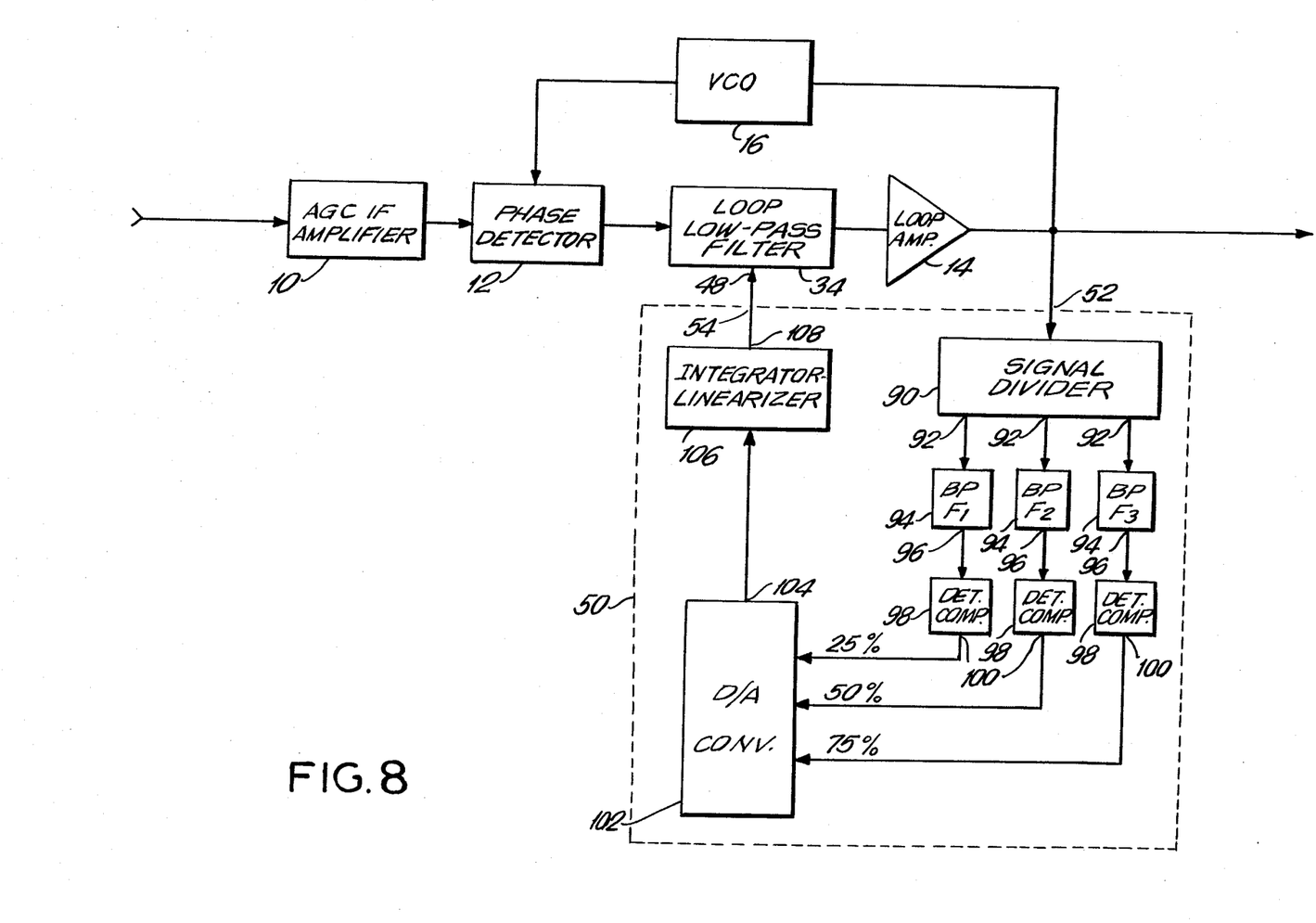
FIG. 8 is a block diagram of the demodulator shown in FIG. 1, including a frequency-responsive baseband loading sensor illustrated in detail.

The loop low-pass filter may in fact be much more complicated than illustrated in the preceding figures, and could be comprised of many more elements, as shown for example in FIG. 7. This configuration utilizes separate, discreet low-pass filter elements 192, each having a different cut off frequency. In this instance, it would be difficult to select any one element to vary. The switching arrangement shown in FIG. 6 may be used to switch the filter elements In FIG. 8, the baseband loading sensor 50 is illustrated in greater detail in the context of the phase-locked loop demodulator. In the arrangement shown here, baseband loading is determined as a function of frequency. The input to the baseband loading sensor 50 is connected to a signal divider 90; the isolated outputs 92 of the divider 90 are connected to three bandpass filters 94. Each filter 94 is tuned to a specific portion of the baseband. For example, given that there are three filters, the center frequencies of the filters can be arbitrarily chosen to represent twenty-five percent, fifty percent, and seventy-five percent of baseband loading. If the baseband is fifty percent loaded, there would be signals present at the outputs of the filters representing twenty-five percent and fifty percent loading, respectively. The outputs 96 of the filters 94 are connected to detector-comparators 98. Each detector-comparator 98 has an output 100, corresponding to the level of baseband loading detected by its preceding bandpass filter 94, connected to an input of a D-A converter 102. The D-A converter 102 selects the "highest" input and provides a proportional analog output 104, which is fed to the input of an integrator-linearizer 106. The output of the integrator-linearizer 106 is the output 54 of the baseband loading sensor 50, which is provided to the control input 48 of the low-pass filter 34.

Figure 9:
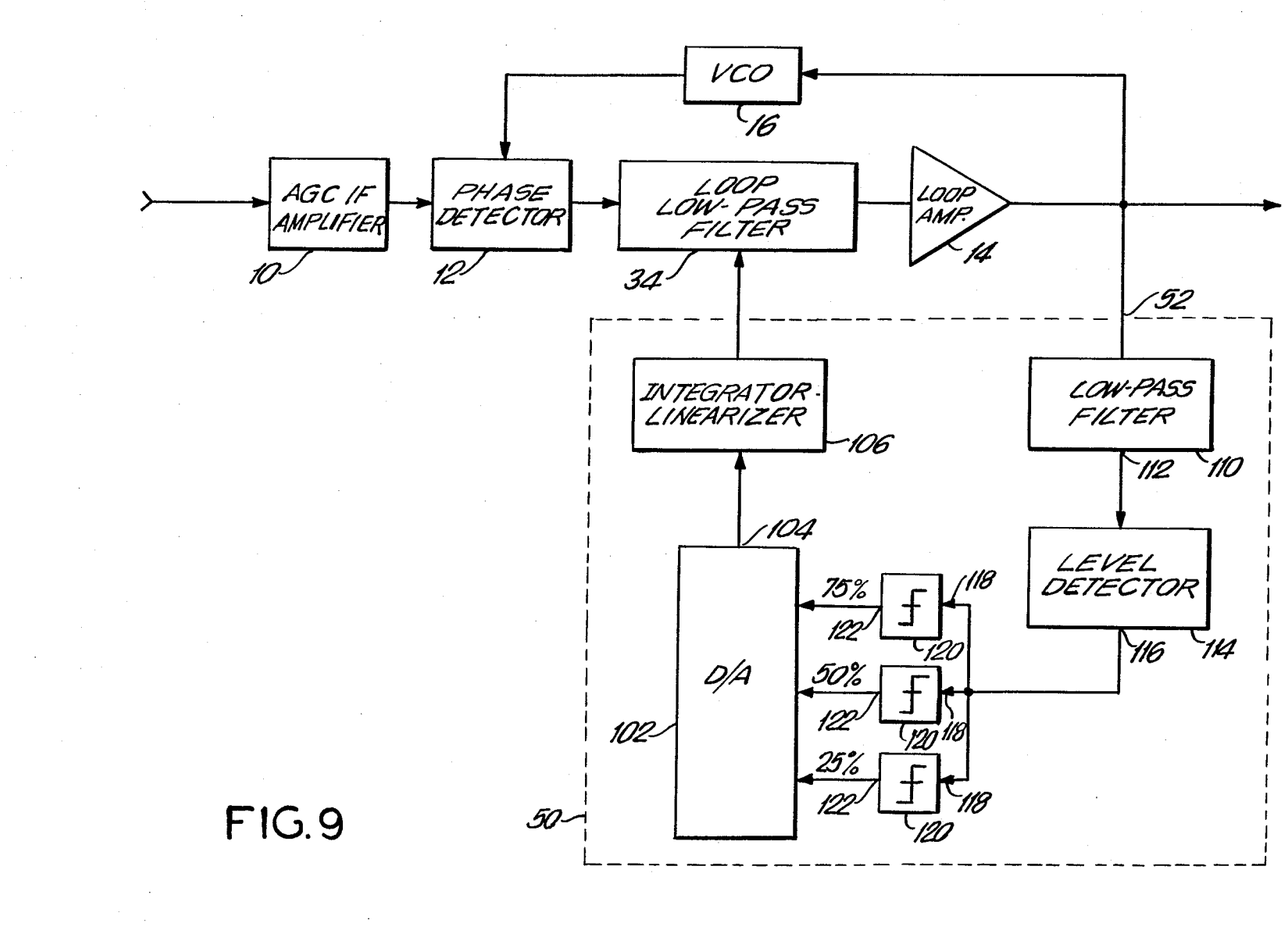
FIG. 9 is a block diagram of the demodulator shown in FIG. 1, including an amplitude-responsive baseband loading sensor illustrated in detail.

In FIG. 9, an amplitude-responsive baseband loading sensor 50 is illustrated in the context of the phase-locked loop demodulator. The baseband output from the loop amplifier 14 is provided to the input 52 of the baseband loading sensor 50. This enters a low-pass filter 110 which has an output 112 provided to a level detector 114. The output of the level detector is a DC signal, proportional to the level of baseband loading. The output 116 is connected to the inputs 118 of three baseband loading comparators 120. Each comparator 120 has an output 122 which goes high when the input reaches its trigger level. In the example shown, the comparators 120 have trigger levels of twenty-five percent, fifty percent, and seventy-five percent, respectively, of full baseband loading. These outputs 122 are connected to a D-A converter 102 which in turn has an analog output 104 connected to an integrator-linearizer 106, as in FIG. 8.

Figure 10:
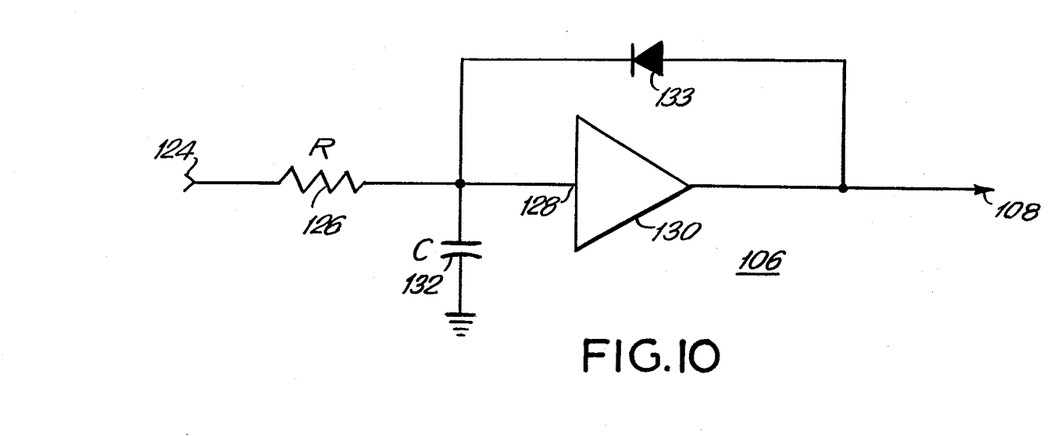
FIG. 10 is a schematic diagram of an integrator-linearizer.

The level detector 114 of FIG. 9 may be a rectifier diode or a more complex circuit configuration well known in the art. The integrator-linearizer 106 may be fashioned from a simple R-C network and may include an active device such as an operational amplifier or discrete circuitry. A representative circuit configuration for the integrator-linearizer is illustrated in FIG. 10. The circuit has an input 124 connected to one end of a resistor 126. The other end of the resistor 126 is connected to the junction of the input 128 of an amplifier 130 and one end of a capacitor 132. The other end of the capacitor is connected to ground. A diode 133 connected between the output 108 and the input 128 provides feedback and linearization. The output 108 of the amplifier 130 forms the output 54 of the baseband loading sensor 50.

Figure 11:
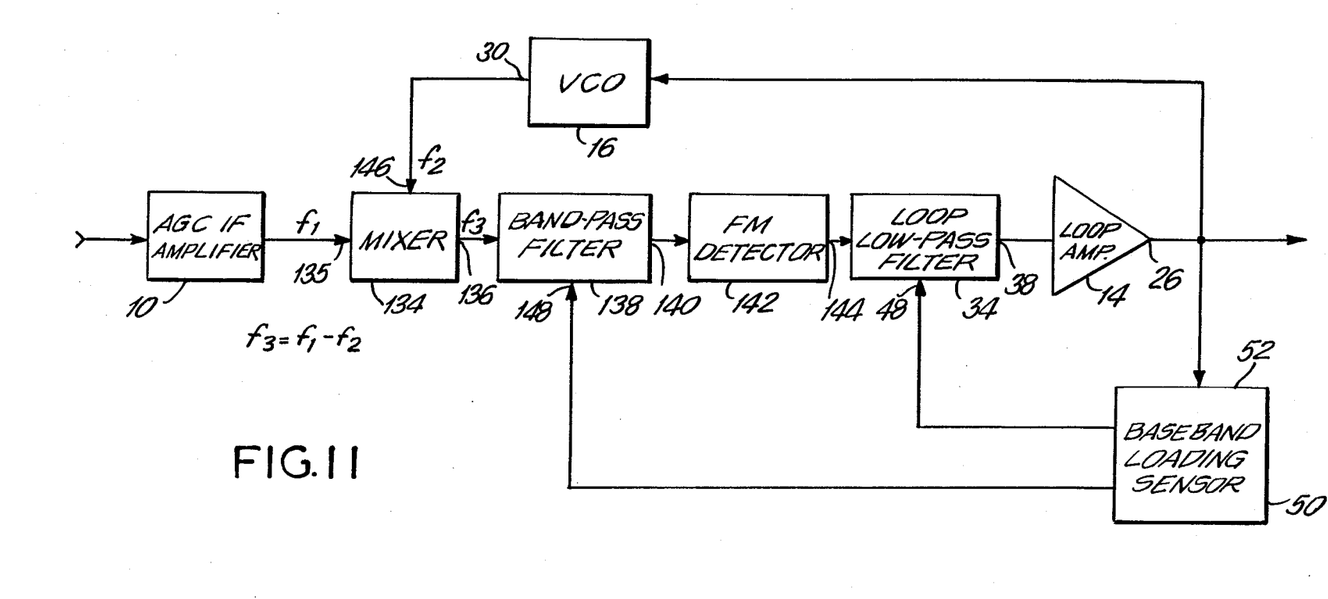
FIG. 11 is a block diagram of a frequency modulation feedback (FMFB) demodulator having a baseband loading sensor.
Figure 12:
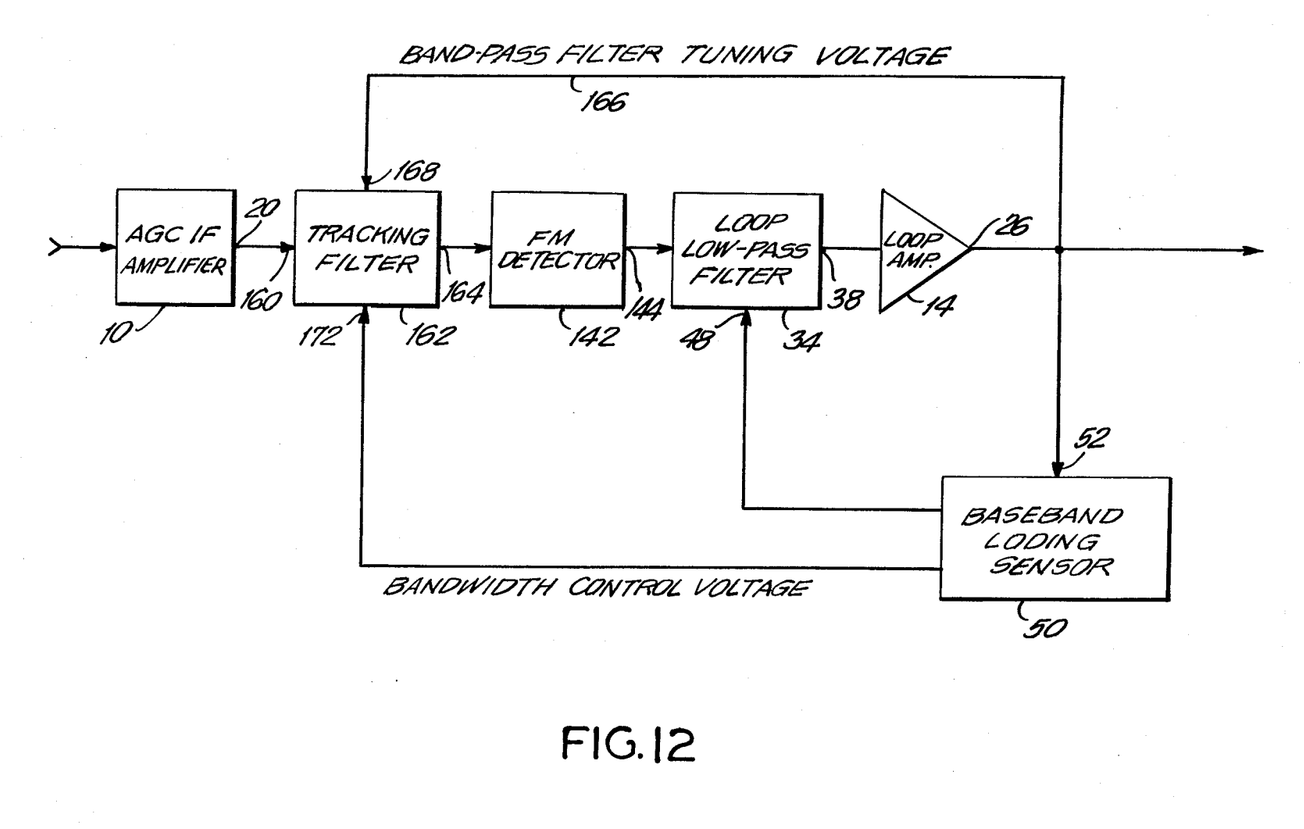
FIG. 12 is a block diagram of a tracking filter demodulator having a baseband loading sensor.

Two additional configurations for threshold extension demodulators are illustrated in FIGS. 11 and 12. In FIG. 11, a frequency modulation feedback (FMFB) demodulator is illustrated. The conventional components of the FMFB demodulator are an AGC IF amplifier 10 at the input feeding the first input 135 of a mixer 134 having an output 136 which is provided to a bandpass filter 138. The bandpass filter 138 is tuned to the IF of the system. The output 140 of the bandpass filter 138 is provided to an FM detector 142. The output 144 of the FM detector 142 passes through a low-pass loop filter 34 to a loop amplifier 14. The output 26 of the loop amplifier 14, which is the baseband output signal, drives a voltage controlled oscillator (VCO) 16 having an output 30 connected to the second input 146 of the mixer 134. This completes the conventional FMFB demodulator.

To incorporate the invention, the output 26 of the loop amplifier 14 is also provided to the input 52 of a baseband loading sensor 50. The baseband loading sensor 50 may be of the configuration in either FIG. 8 or FIG. 9, that is, frequency or amplitude responsive. However, in addition to providing a control signal to the input 48 of the loop low-pass filter 34, it must also provide a control signal to the input 148 of the bandpass filter 138.

Figure 13:
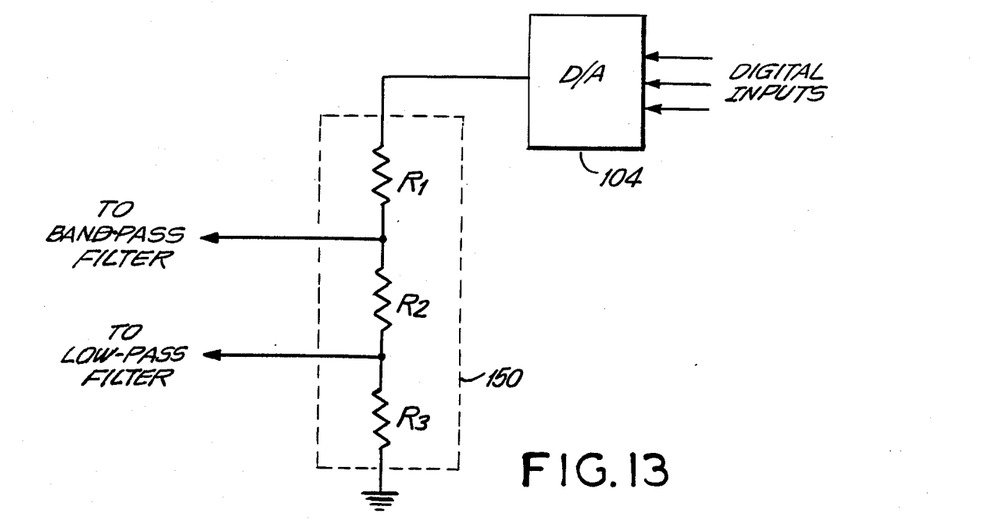
FIG. 13 is a schematic diagram of a control interface for the baseband loading sensor and the filters in an FMFB demodulator and tracking filter demodulator.
Figure 14:
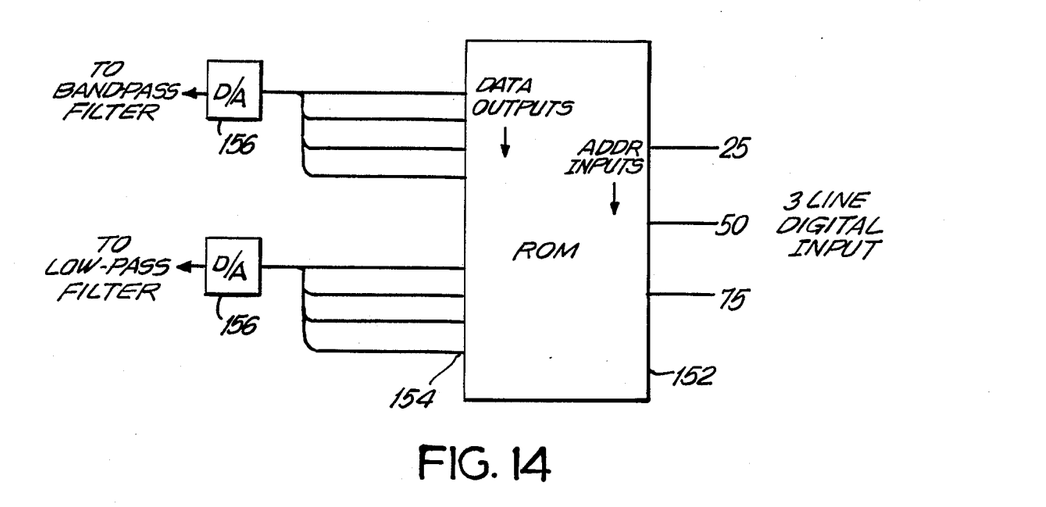
FIG. 14 is a schematic diagram of another form of the control interface illustrated in FIG. 12.

Although the bandpass filter 138 differs structurally from the loop low-pass filter 34, the control signals will either track one another proportionally or at least in the same direction. Accordingly, the output of the D-A converter 104 can be provided to a resistive voltage divider 150, as illustrated in FIG. 13, resulting in proportional signals, or the digital outputs of the comparators may be used to address a read only memory (ROM) 152, as illustrated in FIG. 14. By splitting an eight-bit output from the ROM 152 into two four-bit lines, one can create two independent outputs. Each of these outputs 154 is provided to the inputs of a D-A converter 156. The analog outputs of the D-A converters 156 will then drive the variable elements in the bandpass filter 138 and the loop low-pass filter 34.

Figure 15:
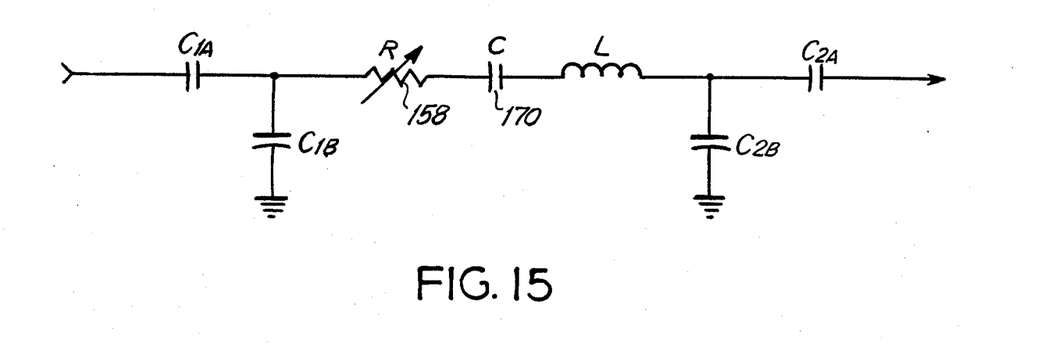
FIG. 15 is a schematic diagram of a bandpass filter for a FMFB or tracking filter demodulator.

One possible configuration for the bandpass filter 138 is illustrated in FIG. 15. The resistive element R 158 is varied in the manner as explained previously in connection with FIGS. 1, 2, 3, and 6. Obviously, one may choose, as a matter of design choice, to use another configuration for the bandpass filter. The important thing to note is that the bandwidth is varied by controlling the value of one of the components.

A tracking filter demodulator is illustrated in FIG. 12. Conventionally, the tracking filter demodulator has an AGC IF amplifier 10 having an output 20 connected to the input 160 of a tracking filter 162. The signal output 164 of the tracking filter 162 is connected to an FM detector 142. The output 144 of the FM detector 142 is supplied to the loop low-pass filter 34. The output of the filter 34 drives the loop amplifier 14. The baseband output signal appears at the output 26 of the loop amplifier 14. It also serves as the bandpass filter tuning voltage 166 which is provided to the tuning input 168 of the tracking filter 162. In the configuration here, this voltage controls the value of capacitor C 170 in FIG. 15. A voltage variable device, such as a varactor diode, may be employed.

To implement the baseband sensitive feature of the invention, the output 26 of the loop amplifier 14 is provided to the input 52 of a baseband loading sensor 50. Using either of the circuits illustrated in FIGS. 13 or 14, one output of the baseband loading sensor is provided to the control input 48 of the loop low-pass filter 34 and another is provided to the bandwidth control input 172 of the tracking filter 162.

In all of the configurations disclosed above, the bandwidth of the demodulators are adjusted according to the level of baseband loading. As the baseband loading decreases, the filters are adjusted accordingly to decrease bandwidth. In this way, the level of system noise is similarly decreased. This results in a better overall signal-to-noise ratio, extending the threshold downward for the given level of carrier amplitude.

Figure 16:
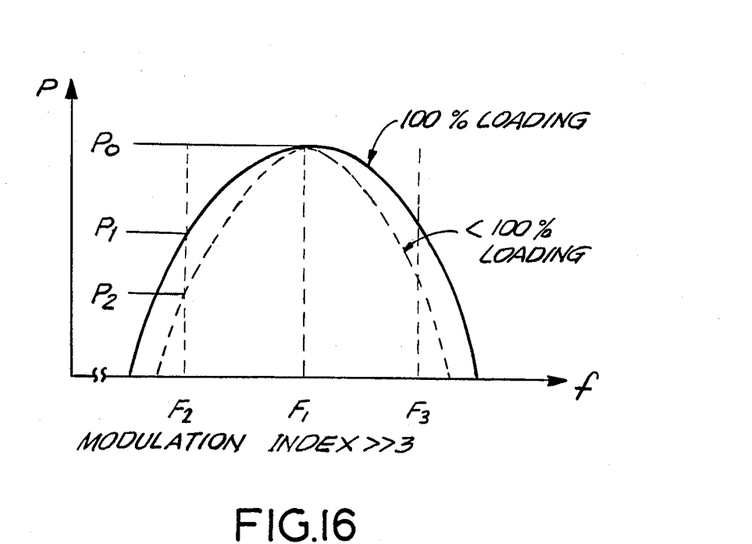
FIGS. 16 and 17 are waveform illustrations of the spectral shapes of modulated FM carriers for modulation indexes greater than and less than 3, respectively.
Figure 17:
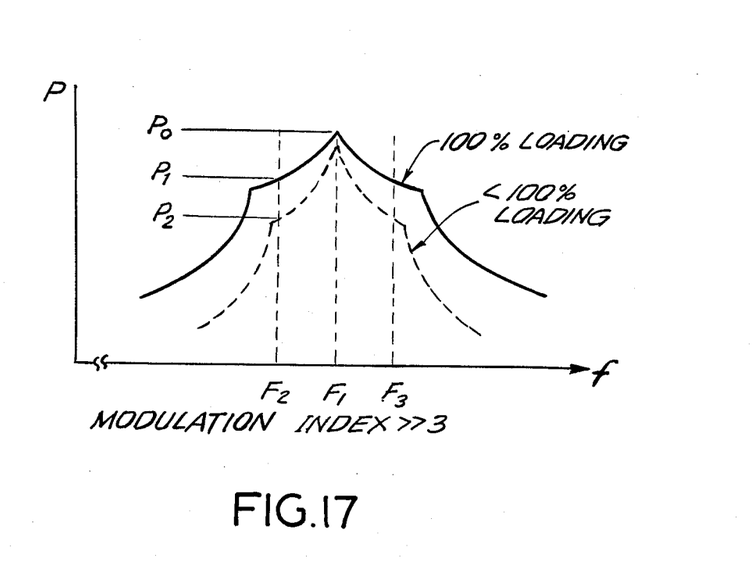

The threshold extension demodulator may also be controlled by measuring the spectral shape of the modulated carrier. A modulated FM carrier has a spectral shape which varies as a function of its loading. Examples of these spectral shapes are illustrated in FIGS. 16 and 17. The spectral shape of the carrier is a function of both its loading and its modulation index.

Modulation index is defined as the peak frequency deviation of the carrier divided by its highest baseband frequency For example, if the peak deviation of the carrier is 4 MHz and its highest baseband frequency is 0.5 MHz, then its modulation index is 8. The spectral shape of a carrier modulated in this fashion is shown in FIG. 16. Similarly, a carrier with a peak deviation of 4 MHz with an upper baseband of frequency of 4 MHz would have a modulation index of 1, and its spectral shape appears as illustrated in FIG. 17.

Figure 18:
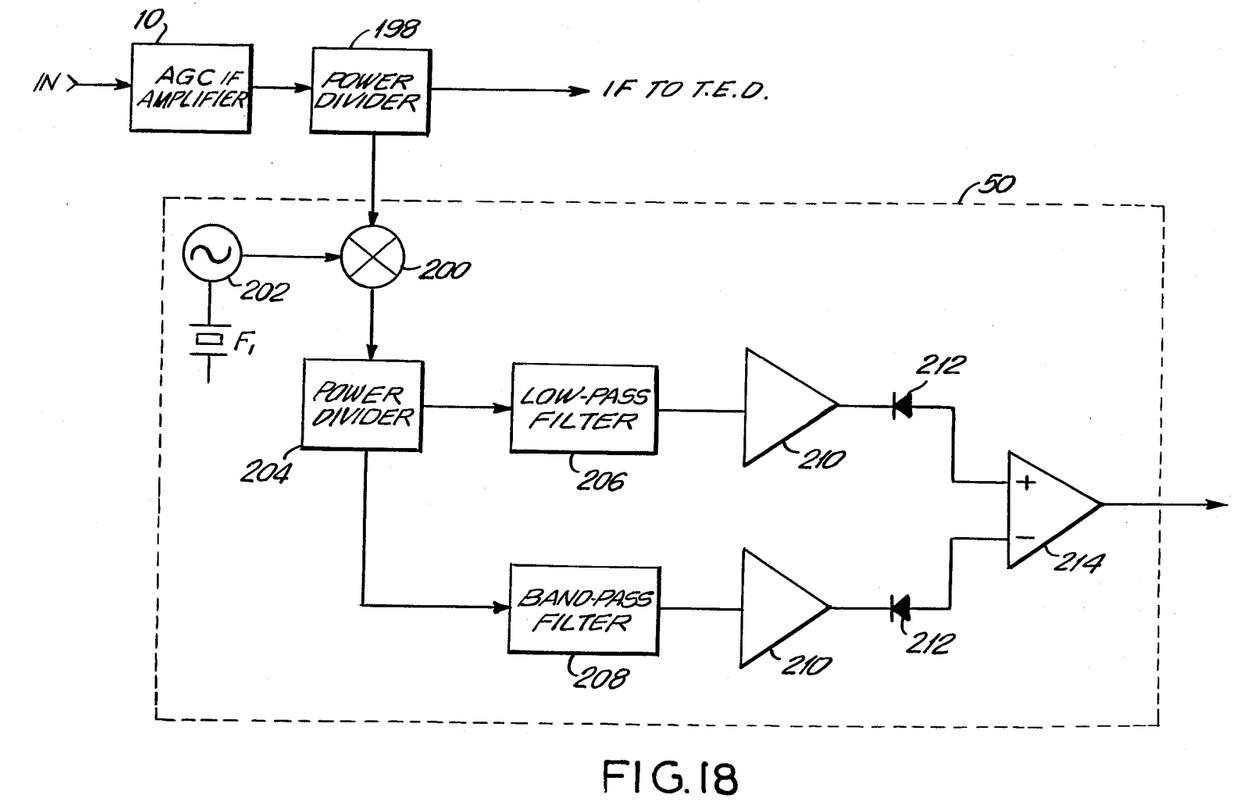
FIG. 18 is schematic block diagram of an alternative embodiment of a baseband loading sensor.

As the loading of a carrier changes (the upper baseband frequency decreases), the peak deviation of the carrier also decreases, but not exactly at the same rate. The effect, however, is that the modulation index of the carrier remains nearly constant. As the carrier loading decreases, the sideband power levels at frequencies F2 and F3 decrease relative to the power level at center frequency. Thus, one can derive the percentage loading of the carrier by measurement of these power levels. This measurement should occur after the AGC amplifier which adjusts its gain to maintain a nearly constant carrier level at its output. This circuit can be implemented as shown in FIG. 18.

Figure 19:
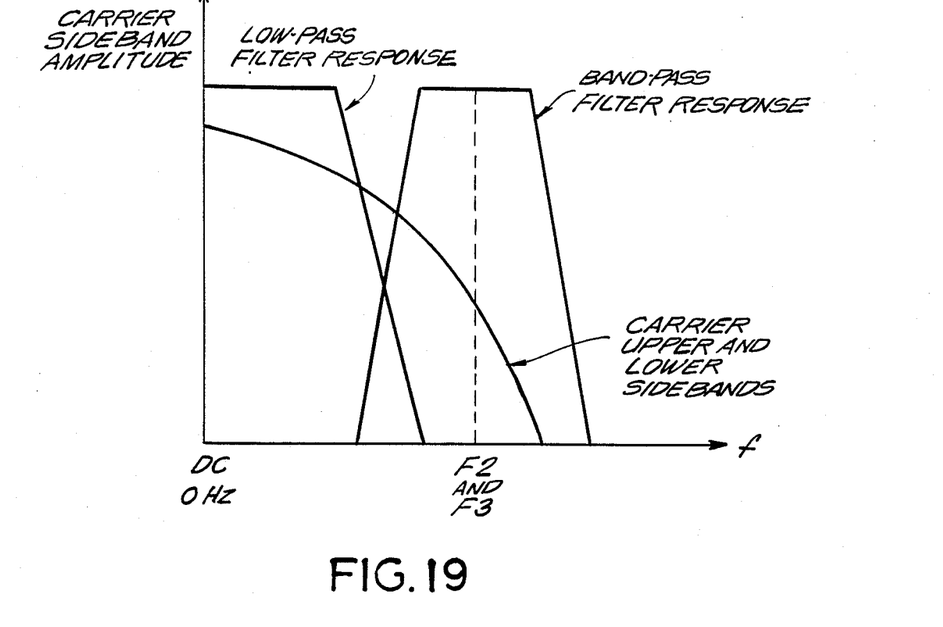
FIG. 19 is a waveform diagram of the output of the mixer in the baseband loading sensor of FIG. 18.

The circuit operates as follows. The constant IF carrier level at the output of the AGC amplifier 10 is split into two parts by a first power divider 198. One path is applied to the threshold extension demodulator (not shown) while the other is applied to the baseband loading sensor 50, which has a mixer 200 at its input. A crystal oscillator 202 tuned to the IF frequency is used to heterodyne the carrier to DC frequency. The upper and lower sidebands of the carrier will be folded over on one another at the output of the mixer 200, as shown in FIG. 19. A second power divider 204 splits the mixer output for application to a low-pass filter 206 and band pass filter 208.

The response of the low-pass filter 206 includes sidebands centered on the carrier center frequency but not sidebands located at frequency offsets of F2 and F3. The bandpass filter response includes sidebands of the carrier centered at F2 and F3 on either side of the carrier. The power levels at the outputs of each filter is amplified by amplifier 210, rectified by diodes 212, and applied to a differential DC amplifier 214. The output of the differential amplifier 214 may be set to maximum or minimum to establish a reference.

When the carrier loading decreases, the power level at the output of the low-pass filter of the 206 increases, while the power level at the output of the bandpass filter 208 decreases. The total power level remains the same, however As a result, the DC levels at the input to the differential amplifier 214 changes, causing an output voltage change proportional to loading level. The DC output of the differential amplifier may thus be used to control directly (FIG. 1) or indirectly (FIGS. 8 or 9) the bandwidth of the threshold extension demodulator.

Figure 20:
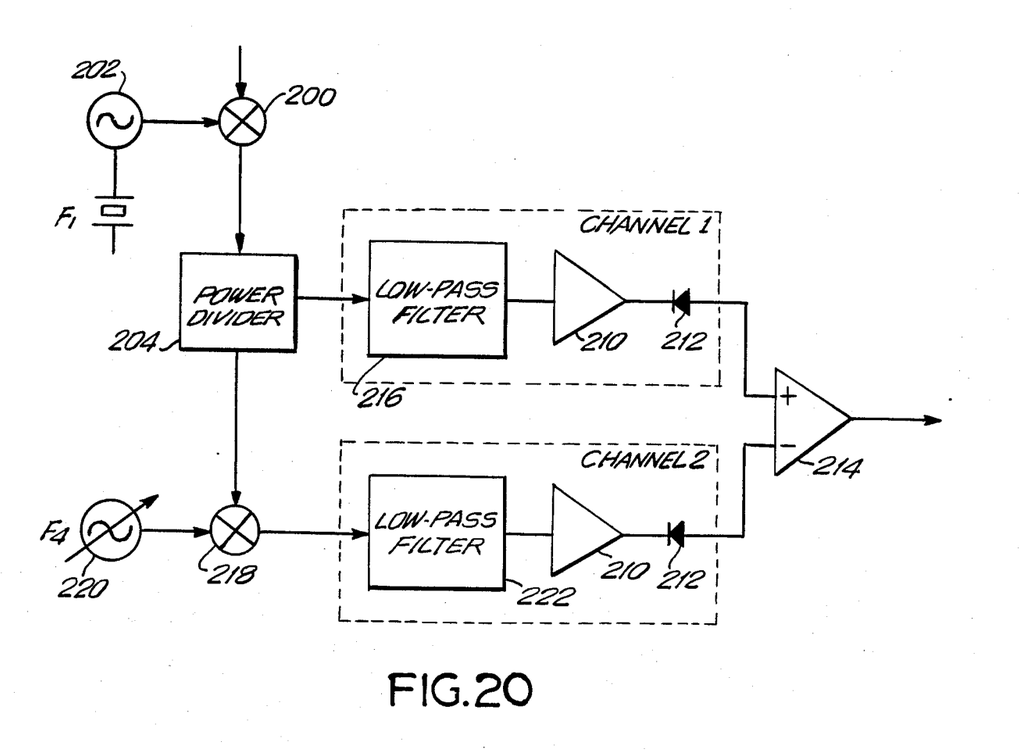
FIG. 20 is a schematic block diagram of an alternative embodiment of the baseband loading sensor illustrated in FIG. 18.

The baseband loading sensor 50 may be further refined as shown in FIG. 20. The IF signal from the first power divider 198 is again provided to a mixer 200, having an input from a crystal oscillator 202. The output of the mixer 200 is fed to a second power divider 204. One output of the divider 204 is provided to a low-pass filter 216; the other output goes to a second mixer 218. A local frequency generator 220 provides a variable frequency (F4) input, which mixes the input down to DC. The generator frequency (F4) is set to the maximum baseband frequency. The output of the second mixer can then be provided to a low-pass filter 222 identical to the unit connected directly to the output of the power divider 204. The output of each low-pass filter 216 and 222 is again provided to amplifier 210, rectifying diodes 212, and a differential amplifier 214.

This refinement permits a relatively simple frequency adjustable oscillator to be used to heterodyne the sideband power levels at F4 to DC. Thus, the bandpass filter need not be replaced for different channel capacities or carrier sizes. The two channels use identical circuits reducing overall cost While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A method of optimizing the noise response of a threshold extension demodulator, used in processing a baseband signal having a bandwidth varying from full to partial bandwidth in proportion to the level of loading in the baseband, the threshold extension demodulator having at least one adjustable filter, comprising the steps of:
    measuring the degree of baseband loading as a function of frequency, wherein the step of measuring the degree of baseband loading includes the step of passing the baseband signal through at least two bandpass filters arranged in parallel; and
    adjusting the amount of threshold extension of the demodulator in response to the present degree of baseband loading in order to optimize the noise response.

2. The method as set forth in claim 1, wherein the step of measuring the degree of baseband loading further includes the step of passing the output of each of the filters through a comparator.

3. A threshold extension demodulator for demodulating a baseband signal varying from full to partial bandwidth in proportion to the level of loading in the baseband, comprising:
    a demodulator loop;
    sensing means for detecting the level of baseband loading, the sensing means including at least two bandpass filters, each filter having a unique center frequency, where each bandpass filter detects loading in a different portion of the baseband; and
    control means, responsive to the sensing means and being connected to the demodulator loop, for adjusting the threshold extension in the demodulator loop in response to the level of baseband loading.

4. A threshold extension demodulator as set forth in claim 3, wherein the sensing means further includes comparators responsive to the outputs of the bandpass filters.

5. A threshold extension demodulator as set forth in claim 4, wherein the sensing means further includes a D-A converter for converting the discrete outputs of the comparators to an analog signal.

6. A method of optimizing the noise response of a threshold extension demodulator, used in processing a baseband signal having a bandwidth varying from full to partial bandwidth in proportion to the level of loading in the baseband, the threshold extension demodulator having at least one adjustable filter, comprising the steps of:

measuring the degree of baseband loading, the step of measuring the degree of baseband loading including the steps of demodulating the baseband signal, and passing the demodulated signal through a low-pass filter and a bandpass filter arranged in parallel; and adjusting the amount of threshold extension of the demodulator in response to the present degree of baseband loading in order to optimize the noise response.

7. The method as set forth in claim 6, wherein the step of measuring the degree of baseband loading further includes and the step of rectifying the output of each of the filters and providing the rectified outputs to a differential amplifier.

8. A threshold extension demodulator for demodulating a baseband signal varying from full to partial bandwidth in proportion to the level of loading in the baseband, comprising:

a demodulator loop;
sensing means for detecting the level of baseband loading, the sensing means including a level detector for rectifying the baseband signal and at least two level comparators, each responsive to a different level of the output of the level detector, for providing discrete outputs representative of the degree of baseband loading; and
control means responsive to the sensing means and having an output connected to the demodulator loop for adjusting the threshold extension in the demodulator loop in response to the level of baseband loading.

9. A threshold extension demodulator as set forth in claim 8, wherein the sensing means further includes a D-A converter for converting the discrete outputs of the comparators to an analog signal.

10. A threshold extension demodulator for demodulating a baseband signal varying from full to partial bandwidth in proportion to the level of loading in the baseband, comprising:

a demodulator loop, the demodulator loop including a loop low-pass filter having at least one adjustable element;
sensing means for detecting the level of baseband loading, the sensing means including at least two bandpass filters, each bandpass filter having a unique center frequency, where each bandpass filter detects loading in a different portion of the baseband; and
control means responsive to the sensing means and having an output connected to the loop low-pass filter for adjusting the threshold extension in the demodulator loop in response to the level of baseband loading.

11. A threshold extension demodulator as set forth in claim 10, wherein the sensing means further includes comparators responsive to the outputs of the bandpass filters.

12. A threshold extension demodulator for demodulating a baseband signal varying from full to partial bandwidth in proportion to the le..el of loading in the baseband, comprising:

a demodulator loop, the demodulator loop including a loop low-pass filter having at least one adjustable element;

sensing means for detecting the level of baseband loading, the sensing means including a level detector for rectifying the baseband signal and at least two level comparators, each responsive to a different level of the output of the level detector, for providing discrete outputs representative of the degree of baseband loading; and
control means responsive to the sensing means and having an output connected to the loop low-pass filter for adjusting the threshold extension in the demodulator loop in response to the level of baseband loading.

13. A threshold extension demodulator as set forth in claim 12, wherein the sensing means further includes a D-A converter for converting the discrete outputs of the comparators to an analog signal.

14. A threshold extension demodulator for demodulating a baseband signal varying from full to partial bandwidth in proportion to the level of loading in the baseband, comprising:

a demodulator loop, the demodulator loop further including a bandpass filter;
sensing means for detecting the level of baseband loading; and
control means responsive to the sensing means and having an output connected to the bandpass filter for adjusting the threshold extension in the demodulator loop in response to the level of baseband loading.

15. A threshold extension demodulator as set forth in claim 14, wherein the demodulator loop further includes a voltage-controlled oscillator having an output and a mixer having an input connected to the output of the voltage controlled oscillator control demodulator.

16. A threshold extension demodulator as set forth in claim 15, wherein the sensing means includes at least two bandpass filters, each bandpass filter having a unique center frequency, where each bandpass filter detects loading in a different portion of the baseband.

17. A threshold extension demodulator as set forth in claim 16, wherein the sensing means further includes comparators responsive to the outputs of the bandpass filters.

18. A threshold extension demodulator as set forth in claim 15, wherein the sensing means includes a level detector for rectifying the baseband signal.

19. A threshold extension demodulator as set forth in claim 18, wherein the sensing means further includes at least two comparators, each responsive to a different level of the output of the level detector, for providing discrete outputs representative of the degree of baseband loading.

20. A threshold extension demodulator as set forth in claim 19, wherein the sensing means further includes a D-A converter for converting the discrete outputs of the comparators to an analog signal.

21. A threshold extension demodulator for demodulating a baseband signal varying from full to partial bandwidth in proportion to the level of loading in the baseband, comprising:

a demodulator loop, the demodulator loop including a tracking filter and a low-pass filter;
sensing means for detecting the level of baseband loading; and
control means responsive to the sensing means and having outputs connected to the tracking and low-pass filters for adjusting the threshold extension in the demodulator loop in response to the level of baseband loading.

22. A threshold extension demodulator as set forth in claim 21 wherein the sensing means includes at least two bandpass filters, each bandpass filter having a unique center frequency, where each bandpass filter detects loading in a different portion of the baseband.

23. A threshold extension demodulator as set forth in claim 22, wherein the sensing means further includes comparators responsive to the outputs of the bandpass filters.

24. A threshold extension demodulator as set forth in claim 21, wherein the sensing means includes a level detector for rectifying the baseband signal.

25. A threshold extension demodulator as set forth in claim 24, wherein the sensing means further includes at least two comparators, each responsive to a different level of the output of the level detector, for providing discrete outputs representative of the degree of baseband loading.

26. A threshold extension demodulator as set forth in claim 25, wherein the sensing means further includes a D-A converter for converting the discrete outputs of the comparators to an analog signal.

27. A threshold extension demodulator for demodulating a baseband signal varying from full to partial bandwidth in proportion to the level of loading in the baseband, comprising:
a demodulator loop;
sensing means for detecting the level of baseband loading, the sensing means including a low-pass filter and a bandpass filter, the low-pass filter having a cut off frequency which is some portion of the full bandwidth of the baseband signal and the bandpass filter having a center frequency equal to the full bandwidth of the baseband signal; and
control means responsive to the sensing means and having an output connected to the demodulator loop for adjusting the threshold extension in the demodulator loop in response to the level of baseband loading.

28. A threshold extension demodulator as set forth in claim 27, wherein the sensing means further includes demodulation means for providing a demodulated baseband signal to the low-pass and bandpass filters.

29. A threshold extension demodulator as set forth in claim 28, wherein the sensing means further includes differential sensing means for determining the difference between the outputs of the low-pass and bandpass filters.

30. A threshold extension demodulator for demodulating a baseband signal varying from full to partial bandwidth in proportion to the level of loading in the baseband, comprising:
a demodulator loop;
sensing means for detecting the level of baseband loading, the sensing means including a first demodulator for providing a first demodulated baseband signal, a first low-pass filter and a second demodulator connected to the output of the first demodulator, and a second low-pass filter connected to the output of the second demodulator; and
control means responsive to the sensing means and having connected to demodulator loop for adjusting the threshold extension in the demodulator loop in response to the level of baseband loading.

31. A threshold extension demodulator as set forth in claim 30, wherein the sensing means further includes differential sensing means for determining the difference between the outputs of the first and second low-pass filters.

* * * * *